(12) United States Patent
Satoh et al.

(10) Patent No.: US 7,679,457 B2
(45) Date of Patent: Mar. 16, 2010

(54) OSCILLATING APPARATUS

(75) Inventors: Hiroyuki Satoh, Tokyo (JP); Haruki Nagami, Tokyo (JP)

(73) Assignee: Advantest Corporation, Tokyo (JP)

( * ) Notice: Subject to any disclaimer, the term of this patent is extended or adjusted under 35 U.S.C. 154(b) by 206 days.

(21) Appl. No.: 11/868,537

(22) Filed: Oct. 8, 2007

(65) Prior Publication Data

US 2009/0091398 A1    Apr. 9, 2009

(51) Int. Cl.
*H03B 27/00* (2006.01)
(52) U.S. Cl. ............... 331/46; 331/2; 331/49; 331/179; 331/167; 331/16
(58) Field of Classification Search ........... 331/179, 331/167, 16, 2, 46, 49
See application file for complete search history.

(56) References Cited

U.S. PATENT DOCUMENTS 6,583,675 B2 * 6/2003 Gomez ................. 331/17
6,788,155 B2 * 9/2004 Chaudhuri et al. .......... 331/46

* cited by examiner

*Primary Examiner*—Arnold Kinkead
(74) *Attorney, Agent, or Firm*—Osha • Liang LLP

(57) ABSTRACT

Provided is an oscillating apparatus that includes a plurality of variable frequency oscillators, each of which is provided in correspondence with a different oscillating band from one another; and a selection section that selects an oscillating signal that is from a variable frequency oscillator provided in correspondence with a designated oscillating band, from among the plurality of variable frequency oscillators, and outputs the selected oscillating signal, where the selection section includes a plurality of selectors connected in a tree structure, each selector outputting a selected one of inputted two or more oscillating signals, and each of the plurality of variable frequency oscillators is connected to a selector positioned at an end of the tree structure of the plurality of selectors.

17 Claims, 8 Drawing Sheets

OSCILLATING APPARATUS

BACKGROUND

1. Technical Field

The present invention relates to an oscillating apparatus. In particular, the present invention relates to an oscillating apparatus capable of changing the frequency of an output signal.

2. Related Art

A test apparatus testing a communication device includes an oscillating apparatus for generating a local signal used at the time of modulation and demodulation. It is preferable that such a test apparatus includes an oscillating apparatus having a wide oscillating band and of high accuracy, for the purpose of performing a test with accuracy.

In recent years, for the purpose of testing high-frequency communication devices, a test apparatus is required to be equipped with an oscillating apparatus capable of outputting an oscillating signal whose C/N at 100 kHz detuning is 95 dBc/Hz or below, and in the range between some GHz and some ten GHz. Furthermore, it is desirable that a test apparatus is equipped with an oscillating apparatus formed as one chip, according to requests such as for cost reduction and for standardizing with other test apparatuses.

SUMMARY

In view of this, it is an object of one aspect of the present invention to provide an oscillating apparatus capable of solving the foregoing problems. This object is achieved by combinations of features described in the independent claims. The dependent claims define further advantageous and concrete examples of the present invention.

According to a first aspect related to the innovations herein, one exemplary oscillating apparatus includes: a plurality of variable frequency oscillators, each of which is provided in correspondence with a different oscillating band from one another; and a selection section that selects an oscillating signal that is from a variable frequency oscillator provided in correspondence with a designated oscillating band, from among the plurality of variable frequency oscillators, and outputs the selected oscillating signal.

The summary clause does not necessarily describe all necessary features of the embodiments of the present invention. The present invention may also be a sub-combination of the features described above.

DESCRIPTION OF EXEMPLARY EMBODIMENTS

One aspect of the invention will now be described based on the embodiments, which do not intend to limit the scope of the present invention, but exemplify the invention. All of the features and the combinations thereof described in the embodiment are not necessarily essential to the invention.

Figure 1:
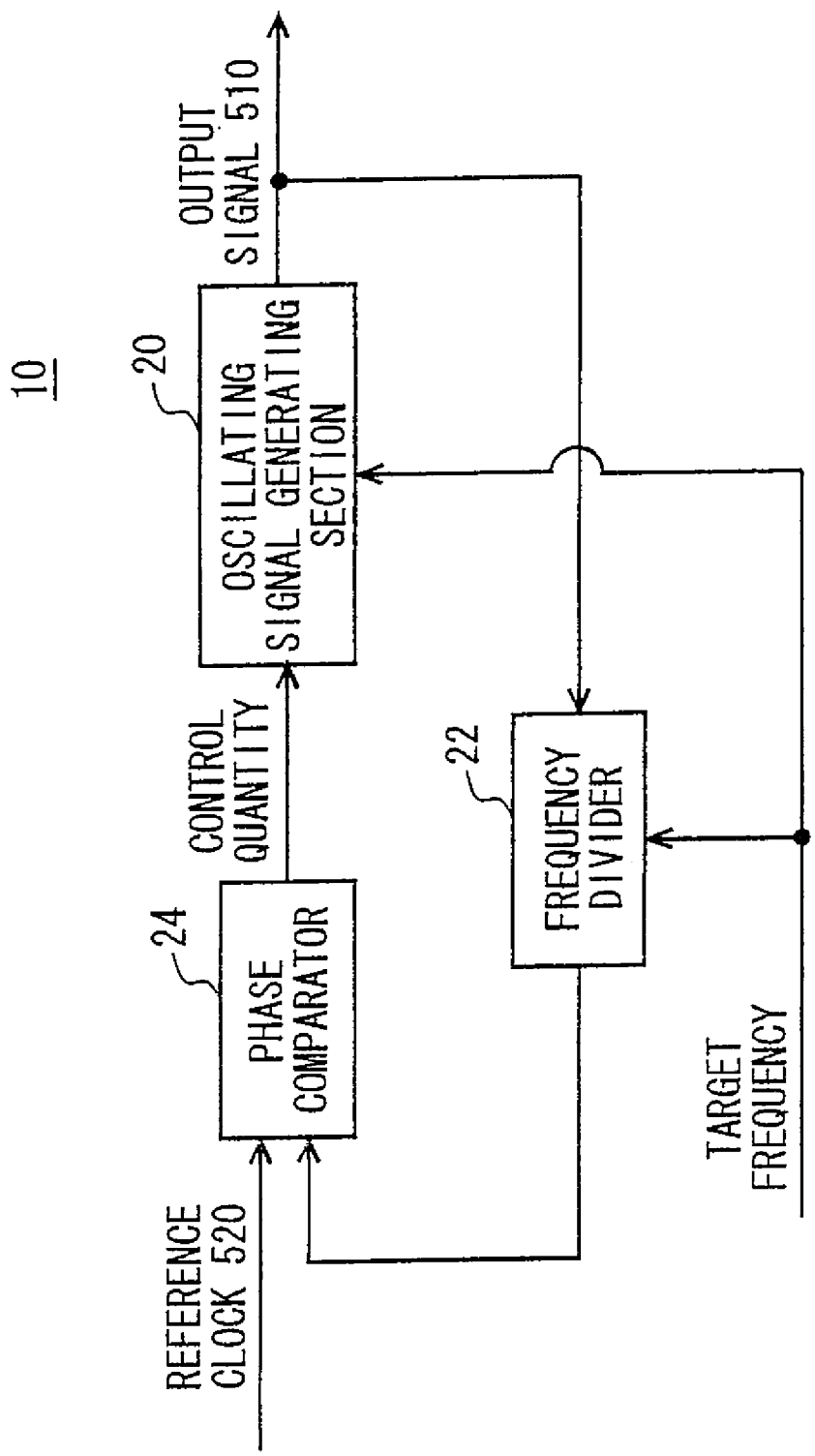
FIG. 1 shows a configuration of an oscillating apparatus 10 according to the present embodiment.

FIG. 1 shows a configuration of an oscillating apparatus 10 according to the present embodiment. The oscillating apparatus 10 outputs an output signal 510 that is in accordance with a target frequency supplied from outside. As an example, the oscillating apparatus 10 is able to change a frequency of an output signal 510, in the range between 6 GHz or above and some ten GHz or below.

The oscillating apparatus 10 includes an oscillating signal generating section 20, a frequency divider 22, and a phase comparator 24. The oscillating signal generating section 20 outputs an output signal 510 having a frequency that is in accordance with a supplied control signal. In the present embodiment, the oscillating signal generating section 20 may output an oscillating signal 530 having a frequency that is in accordance with a supplied control voltage Vcont, as an example.

The frequency divider 22 outputs a frequency dividing signal resulting from dividing the frequency of the output signal 510. The frequency divider 22 is supplied with a frequency dividing ratio that is in accordance with a target frequency from outside. The frequency dividing ratio is, as an example, a value resulting from dividing a target frequency by a frequency of a reference clock 520. According to this, the frequency divider 22 is able to output a frequency dividing signal that has a frequency matching the reference clock 520 and that is synchronized with the phase of the output signal 510.

The phase comparator 24 compares the phase of the output signal 510 and the phase of the reference clock 520. Then the phase comparator 24 controls the frequency of the output signal 510 outputted from the oscillating signal generating section 20, based on the comparison result. In the present embodiment, the phase comparator 24 detects the phase difference between the frequency dividing signal outputted from the frequency divider 22 and the reference clock 520. The phase comparator 24 supplies a control voltage Vcont that is in accordance with the detected phase difference to the oscillating signal generating section 20, and causes the oscillating signal generating section 20 to output an output signal 510 having a frequency yielding the phase difference between the frequency dividing signal and the reference clock 520 of 0.

Such an oscillating apparatus 10 is able to output an output signal 510 whose phase is synchronized with that of the reference clock 520 and whose frequency matches the target frequency. Note that the oscillating apparatus 10 may adopt a configuration that is not equipped with the frequency divider 22. In this case, the phase comparator 24 compares the phase of the output signal 510 outputted from the oscillating signal generating section 20 and the phase of the reference clock 520.

Figure 2:
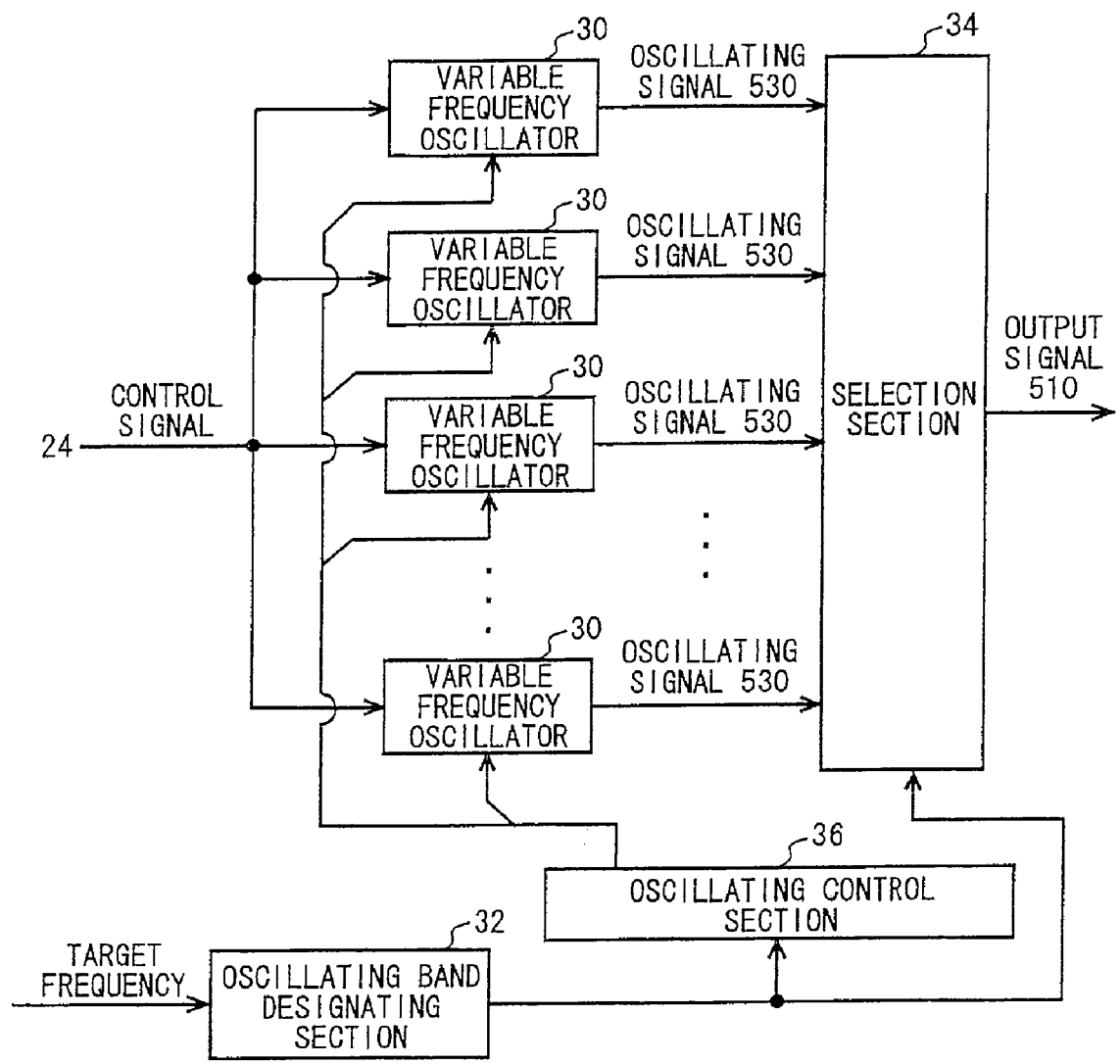
FIG. 2 shows a configuration of an oscillating signal generating section 20 according to the present embodiment.

FIG. 2 shows a configuration of an oscillating signal generating section 20 according to the present embodiment. The oscillating signal generating section 20 includes a plurality of variable frequency oscillators 30, an oscillating band designating section 32, a selection section 34, and an oscillating control section 36.

Each of the plurality of variable frequency oscillators 30 outputs an oscillating signal 530 having a frequency that is in accordance with a control signal supplied from the phase comparator 24. Each of the plurality of variable frequency oscillators 30 outputs an oscillating signal 530 corresponding to an oscillating band different from each other. That is, each of the plurality of variable frequency oscillators 30 has an oscillating band different from each other. Each of the plurality of variable frequency oscillators 30 outputs an oscillating signal 530 whose frequency changes in the oscillating band of itself, according to a supplied control signal.

Each of the plurality of variable frequency oscillators 30 may have an oscillating band that corresponds to each division range resulting from dividing the entire oscillating band (e.g. 6 GHz or above and 13 GHz or below) for the oscillating signal generating section 20 into a plurality of ranges. For example, each of the plurality of variable frequency oscillators 30 may have an oscillating band that corresponds to each division range resulting from dividing the range between 6 GHz or above and 13 GHz or below, by each 0.5 GHz or by each 1.0 GHz.

Each of the plurality of variable frequency oscillators 30 may be such that part of the high band side and of the low band side overlaps with a respective adjacent oscillating band. According to this, the plurality of variable frequency oscillators 30 are prevented from having a frequency range in which signal outputting is not possible, within the entire oscillating band for the oscillating signal generating section 20, even when the oscillating band for each variable frequency oscillator 30 is deviated due to manufacturing errors or the like.

The oscillating band designating section 32 is supplied with a target frequency from outside, and selects an oscillating band that includes the supplied target frequency, from among the oscillating bands included in the plurality of variable frequency oscillators 30 respectively. Then the oscillating band designating section 32 designates the selected oscillating band, to the selection section 34 and the oscillating control section 36.

The selection section 34 selects an oscillating signal 530 that is from a variable frequency oscillator 30 provided in correspondence with the oscillating band designated by the oscillating band designating section 32, from among a plurality of variable frequency oscillators 30. Then, the selection section 34 outputs the selected oscillating signal 530 to outside, as an output signal 510.

The oscillating control section 36 controls, to perform an oscillating operation, a variable frequency oscillator 30 that has the oscillating band designated by the oscillating band designating section 32, from among the plurality of variable frequency oscillators 30. Together with this operation, the oscillating control section 36 may stop oscillation of at least one variable frequency oscillator 30 (preferably all the variable frequency oscillators 30) provided in correspondence with any oscillating band different from the oscillating band designated by the oscillating band designating section 32, as an example.

In this case, as an example, the oscillating control section 36 may stop oscillation of a variable frequency oscillator 30 by stopping an operation for amplifying a resonance signal of the variable frequency oscillator 30. Alternatively, as an example, the oscillating control section 36 may stop oscillation of a variable frequency oscillator 30 by stopping outputting of an oscillating signal 530. According to this, the oscillating control section 36 is able to reduce the power consumption by the oscillating signal generating section 20. Furthermore, the oscillating control section 36 is able to prevent such a case that an output signal 510 includes, as a noise, a signal of an oscillating band that is different from the designated oscillating band.

The oscillating signal generating section 20 as explained above is able to output an output signal 510 of a frequency range that is wider than and exceeding a frequency range that can be outputted by one variable frequency oscillator 30, with high accuracy. For example, the oscillating signal generating section 20 is able to output an output signal 510 of an arbitrary frequency in the range between some GHz and some ten GHz.

Figure 3:
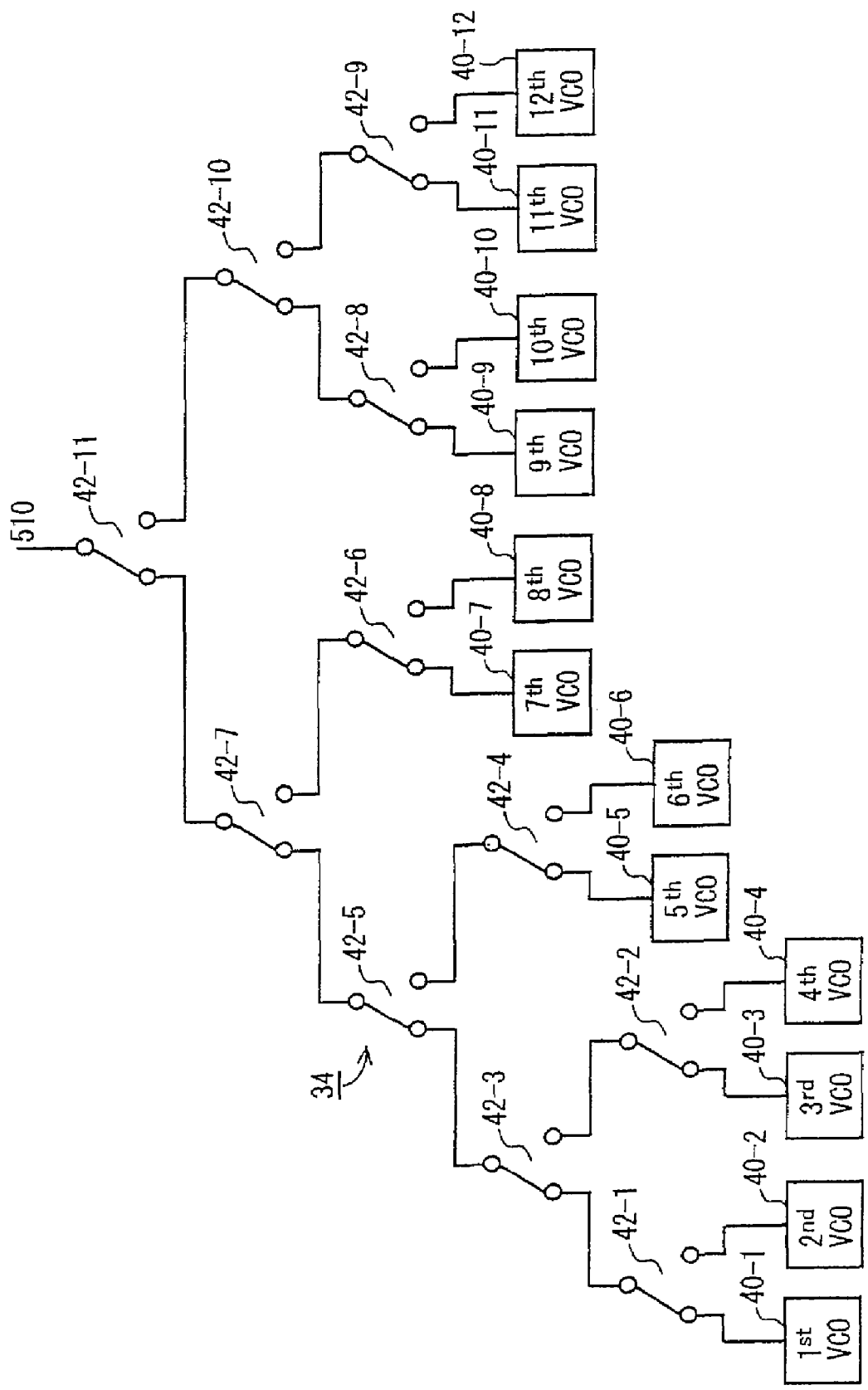
FIG. 3 shows one example of a plurality of selectors 42 and a plurality of VCOs 40, connected in a tree structure.

FIG. 3 shows one example of a plurality of selectors 42 and a plurality of VCOs 40, connected in a tree structure. In the present embodiment, the oscillating signal generating section 20 may include a plurality of voltage control oscillators (VCO) 40, as one example of the plurality of variable frequency oscillators 30. Each of the plurality of VCOs 40 is supplied with a control voltage Vcont as a control signal, by the phase comparator 24. Each of the plurality of VCOs 40 outputs an oscillating signal 530 of a frequency that is in accordance with the supplied control voltage Vcont.

The selection section 34 may include, as an example, a plurality of selectors 42 that respectively output an oscillating signal 530 selected from among two or more inputted oscillating signals 530. The plurality of selectors 42 are connected in a tree structure.

The plurality of VCOs 40 are connected to selectors 42 positioned at the end of the tree structure of the plurality of selectors 42. Each of the plurality of selectors 42 selects one oscillating signal 530 from among the inputted two or more oscillating signals 530, and outputs the same, so that an oscillating signal 530 outputted from one VCO 40 having the designated oscillating band from among the plurality of VCOs 40 is outputted from the selector 42 positioned on topmost of the tree structure.

The oscillating signal generating section 20 may include a first VCO 40-1—a twelfth VCO 40-12, as an example. The first VCO 40-1 has the lowest oscillating band. The twelfth VCO 40-12 has the highest oscillating band. The oscillating band of the VCOs 40 becomes higher in the order from the first VCO 40-1 to the twelfth VCO 40-12.

The selection section 34 may include a first selector 42-1—an eleventh selector 42-11, as an example. Each of the first selector 42-1—the eleventh selector 42-11 receives two oscillating signals 530, selects one of the received two oscillating signals 530, and outputs the same.

The first selector 42-1 receives oscillating signals 530 outputted from the first VCO 40-1 and the second VCO 40-2. The second selector 42-2 receives oscillating signals 530 outputted from the third VCO 40-3 and the fourth VCO 40-4. The third selector 42-3 receives oscillating signals 530 outputted from the first selector 42-1 and the second selector 42-2.

The fourth selector 42-4 receives oscillating signals 530 outputted from the fifth VCO 40-5 and the sixth VCO 40-6. The fifth selector 42-5 receives oscillating signals 530 outputted from the third selector 42-3 and the fourth selector 42-4. The sixth selector 42-6 receives oscillating signals 530 outputted from the seventh VCO 40-7 and the eighth VCO 40-8. The seventh selector 42-7 receives oscillating signals 530 outputted from the fifth selector 42-5 and the sixth selector 42-6. The eighth selector 42-8 receives oscillating signals 530 outputted from the ninth VCO 40-9 and the tenth VCO 40-10.

The ninth selector 42-9 receives oscillating signals 530 outputted from the eleventh VCO 40-11 and the twelfth VCO 40-12. The tenth selector 42-10 receives oscillating signals 530 outputted from the eighth selector 42-8 and the ninth selector 42-9.

The eleventh selector 42-11 receives oscillating signals 530 outputted from the seventh selector 42-7 and the tenth selector 42-10. Then the eleventh selector 42-11 outputs the selected oscillating signal 530 as an output signal 510 of the oscillating signal generating section 20, since the eleventh selector 42-11 is positioned on topmost of the tree structure.

The plurality of selectors 42 are connected in a tree structure in the stated manner. Also in the stated manner, the plurality of VCOs 40 are connected to a plurality of selectors 42 positioned at the end of the tree structure of a plurality of selectors 42.

Figure 4:
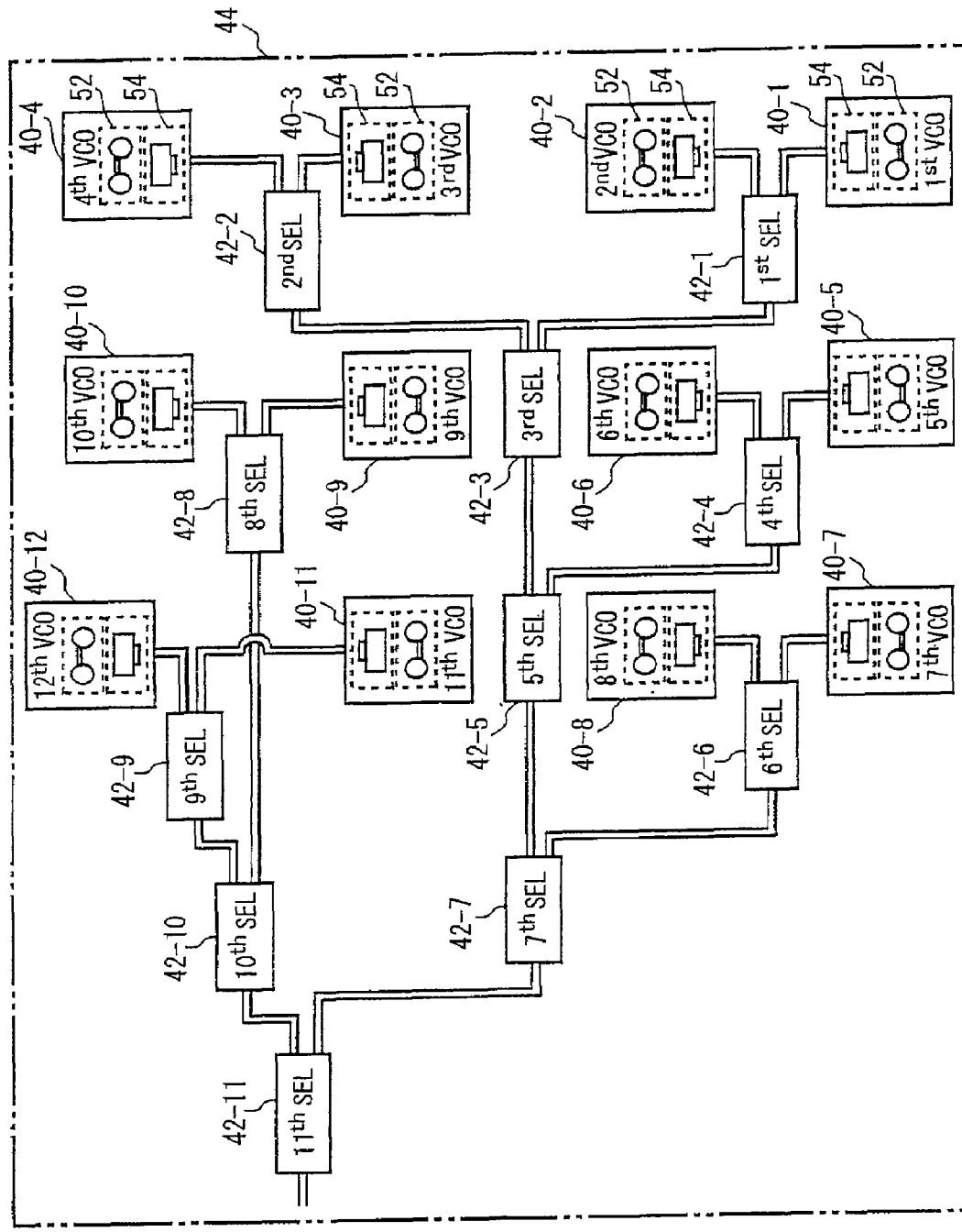
FIG. 4 shows one example of a plurality of VCOs 40 and a plurality of selectors 42 provided on one semiconductor chip.

FIG. 4 shows one example of a plurality of VCOs 40 and a plurality of selectors 42 provided on one semiconductor chip. The plurality of VCOs 40 and the plurality of selectors 42 may be provided on one semiconductor chip 44. According to this, the oscillating signal generating section 20 enables smaller size as well as cost reduction.

In addition, as an example, the plurality of VCOs 40 may output a differential oscillating signal 530. In addition, each of the plurality of selectors 42 may receive two sets of differential oscillating signals 530 and output a selected set of differential oscillating signals 530, as an example. Furthermore, each of the plurality of selectors 42 may amplify a selected differential oscillating signal 530 and transmit the same to the oscillating signal 530 in the following stage.

In addition, as an example, the number of selectors 42 through which an oscillating signal 530 outputted from one VCO 40 passes until it is outputted from the oscillating signal generating section 20 may be smaller than the number of selectors 42 through which an oscillating signal 530 outputted from at least one of the other VCOs 40 provided in correspondence with the oscillating band of a frequency lower than that of the one VCO 40 passes until it is outputted from the oscillating signal generating section 20. That is, connection in the tree structure of the plurality of selectors 42 may be such that the number of selectors 42 through which an oscillating signal 530 passes is larger for the higher frequency and smaller for the lower frequency.

In the present example, the number of selectors 42 through which the oscillating signal 530 outputted from the twelfth VCO 40-12 passes until it is outputted from the oscillating signal generating section 20 is 3. In contrast, the number of selectors 42 through which the oscillating signal 530 outputted from the first VCO 40-1 provided in correspondence with the band of a frequency lower than that of the twelfth VCO 40-12 passes until it is outputted from the oscillating signal generating section 20 is 5. According to such a selection section 34, the number of selectors 42 through which an oscillating signal 530 passes becomes smaller as the frequency of the oscillating signal 530 becomes higher.

In addition, as an example, the wiring through which an oscillating signal 530 outputted from one VCO 40 passes until it is outputted from the oscillating signal generating section 20 may be shorter than the wiring through which an oscillating signal 530 outputted from at least one of the other VCOs 40 provided in correspondence with an oscillating band of a frequency lower than that of the one VCO 40 passes until it is outputted from the oscillating signal generating section 20. That is, connection in the tree structure of the plurality of selectors 42 may be such that the wiring through which an oscillating signal 530 passes is longer for the higher frequency and shorter for the lower frequency.

In the present example, the wiring through which the oscillating signal 530 outputted from the twelfth VCO 40-12 passes until it is outputted from the oscillating signal generating section 20 is shorter than the wiring through which the oscillating signal 530 outputted from the first VCO 40-1 passes until it is outputted from the oscillating signal generating section 20. According to such a selection section 34, it is possible to shorten the wiring through which an oscillating signal 530 passes as the frequency of the oscillating signal 530 becomes higher.

In addition, as an example, each of the plurality of VCOs 40 may include a resonance circuit 52 provided in an adjacent area, and an amplifying circuit 54 amplifying the resonance of the resonance circuit 52 and outputting the result as an oscillating signal 530. Two VCOs 40 connected to a selector 42 positioned at the end of the tree structure of the plurality of selectors 42 are provided so that the respective amplifying circuits 54 are placed in areas adjacent to each other. As an example, the two VCOs 40 are provided on a semiconductor chip 44 so that the respective amplifying circuits 54 face each other sandwiching therebetween the selector 42 to which the two VCOs 40 are connected. Furthermore, in these two VCOs 40, the two resonance circuits 52 are provided in position sandwiching the two amplifying circuits 54.

Each of the plurality of VCOs 40 outputs an oscillating signal 530 from an amplifying circuit 54. Therefore, each of the plurality of VCOs 40 arranged in the above way is able to convey an oscillating signal 530 in a short distance with respect to selectors 42 positioned at the end of the tree structure of the plurality of selectors 42.

Figure 5:
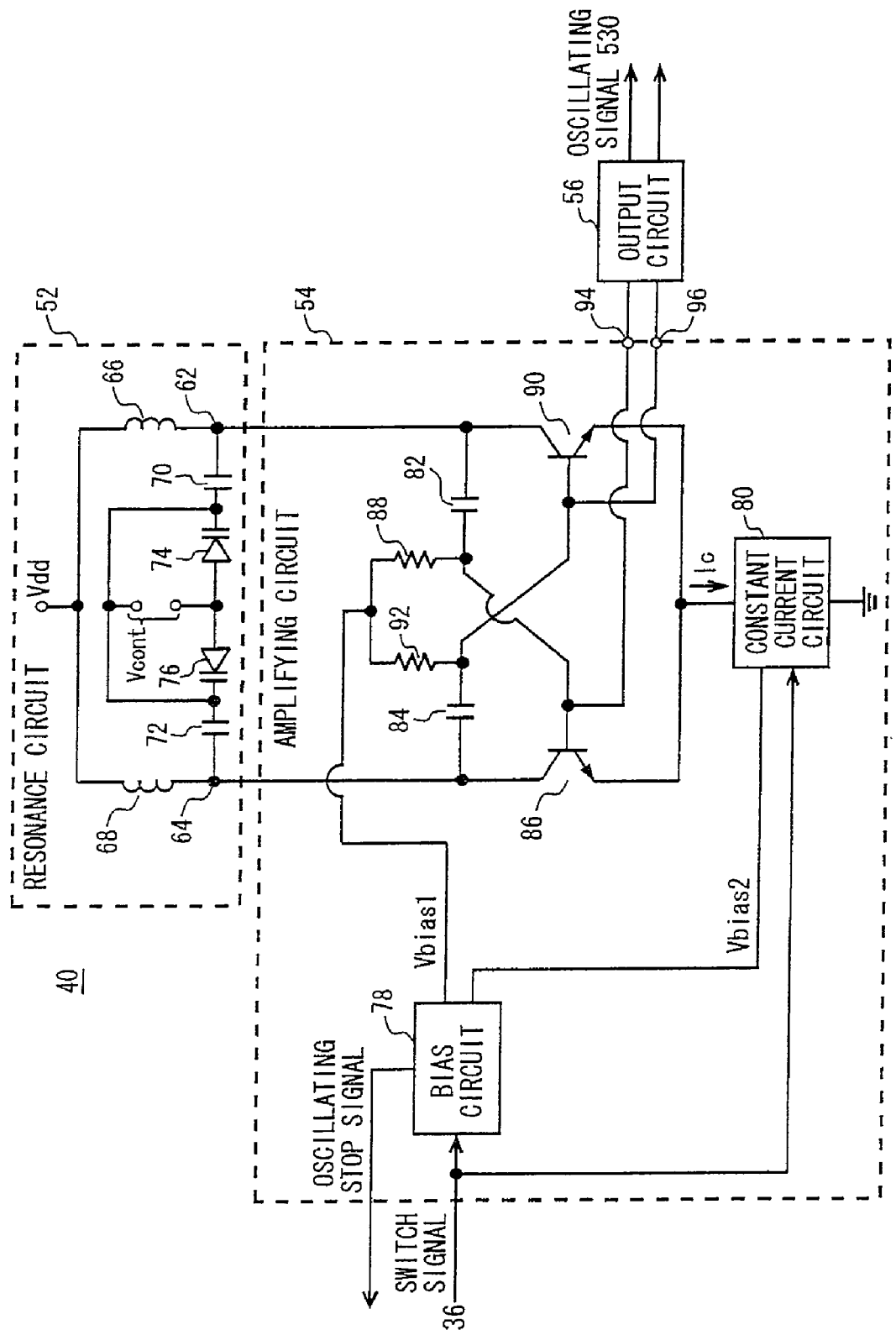
FIG. 5 shows one example of a circuit configuration of a VOC 40 outputting a differential oscillating signal 530.

FIG. 5 shows one example of a circuit configuration of a VOC 40 outputting a differential oscillating signal 530. The VOC 40 outputs a differential oscillating signal 530 of a frequency that is in accordance with a supplied control voltage Vcont.

The resonance circuit 52 generates an oscillating signal 530 of a frequency that is in accordance with a control voltage Vcont supplied from the phase comparator 24. In the present embodiment, the resonance circuit 52 may be an LC circuit whose resonance frequency changes in accordance with the control voltage Vcont, as an example. In the present embodiment, the resonance circuit 52 causes the resonance frequency component of a signal supplied from the amplifying circuit 54 to pass, while attenuating the other frequency components. According to this, the resonance circuit 52 is able to generate an oscillating signal 530 of a frequency that is in accordance with the control voltage Vcont supplied from the phase comparator 24.

The amplifying circuit 54 amplifies an oscillating signal 530 generated by the resonance circuit 52 and feeds back the result to the resonance circuit 52. To be more specific, the amplifying circuit 54 performs positive feedback amplification to the oscillating signal 530 generated by the resonance circuit 52, and supplies the result to the resonance circuit 52. That is, the amplifying circuit 54 functions as a negative resistance connected between the input/output of the resonance circuit 52.

Such resonance circuit 52 and amplifying circuit 54 are able to continue outputting an oscillating signal 530 of a frequency that is in accordance with a control voltage Vcont. That is, the resonance circuit 52 and the amplifying circuit 54 are able to perform an oscillating operation.

An output circuit 56 receives an oscillating signal 530 supplied to the amplifying circuit 54 from the resonance circuit 52, and outputs the oscillating signal 530 to outside. The output circuit 56 may be a circuit having a high input impedance and a low output impedance, as an example. Such an output circuit 56 is able to output a stable oscillating signal 530, without subjecting the resonance circuit 52 and the amplifying circuit 54 to an effect such as a load fluctuation of an outside circuit in a later stage.

As an example, the resonance circuit 52 may include a positive-side resonance inductor 66, a negative-side resonance inductor 68, a positive-side resonance capacitor 70, a negative-side resonance capacitor 72, a positive-side variable capacity diode 74, and a negative-side variable capacity diode 76. The resonance circuit 52 outputs a noninversion oscillating signal 530 from a first contact point 62. In addition, the resonance circuit 52 outputs an inversion oscillating signal 530 from a second contact point 64.

The positive-side resonance inductor 66 is connected between the power supply voltage (Vdd) and the first contact point 62. The negative-side resonance inductor 68 is connected between the power supply voltage (Vdd) and the second contact point 64.

One end of the positive-side resonance capacitor 70 is connected to the first contact point 62, and the other end thereof is connected to the cathode of the positive-side variable capacity diode 74. One end of the negative-side resonance capacitor 72 is connected to the second contact point 64, and the other end thereof is connected to the cathode of the negative-side variable capacity diode 76. The anode of the positive-side variable capacity diode 74 is connected to the anode of the negative-side variable capacity diode 76.

The positive-side variable capacity diode 74 and the negative-side variable capacity diode 76 receive, between the anode and the cathode, a control voltage Vcont supplied from the phase comparator 24. The capacity of the positive-side variable capacity diode 74 and of the negative-side variable capacity diode 76 changes according to the control voltage Vcont received between the anode and the cathode.

In the resonance circuit 52 as stated above, the resonance frequency of impedance between the first contact point 62 and the second contact point 64 changes according to the supplied control voltage Vcont. Accordingly, the resonance circuit 52 is able to output a differential oscillating signal 530 of a frequency that is in accordance with the supplied control voltage Vcont.

As an example, the amplifying circuit 54 may include a bias circuit 78, a constant current circuit 80, a positive-side capacitor 82, a negative-side capacitor 84, a first amplifying transistor 86, a negative-side bias resistance 88, a second amplifying transistor 90, and a positive-side bias resistance 92. The amplifying circuit 54 receives a noninversion oscillating signal 530 from the first contact point 62, performs an inverting amplification to the noninversion oscillating signal 530, and feeds back the result to the second contact point 64. In addition, the amplifying circuit 54 receives an inversion oscillating signal 530 from the second contact point 64, performs an inverting amplification to the inversion oscillating signal 530, and feeds back the result to the first contact point 62.

Furthermore, the amplifying circuit 54 outputs a noninversion oscillating signal 530 from the positive-side oscillating signal output end 94. In addition, the amplifying circuit 54 outputs an inversion oscillating signal 530 from the negative-side oscillating signal output end 96.

The bias circuit 78 generates a bias voltage for operating the amplifying circuit 54. As an example, the bias circuit 78 may output a first bias voltage Vbais1 of about 4 volts and a second bias voltage Vbais2 of about 3 volts that is lower than the first bias voltage Vbais1.

The bias circuit 78 receives, from the oscillating control section 36, a switch signal instructing oscillation and oscillating stop for the VCO 40. When an oscillating stop instruction is received, the bias circuit 78 drops the first bias voltage Vbias1 and the second Vbias2 to the ground potential. As a result, the bias circuit 78 is grounded by the positive-side oscillating signal output end 94 and the negative-side oscillating signal output end 96. According to this, the VCO 40 is able to stop the amplifying operation of the oscillating signal 530 performed by the amplifying circuit 54, and to stop the oscillation of the VCO 40.

Furthermore, as an example, when the VCO 40 has stopped an oscillating operation, the bias circuit 78 may generate an oscillating stop signal indicating that the VCO 40 has stopped the oscillating operation. As an example, the bias circuit 78 may generate an oscillating stop signal that indicates the ground potential when the VCO 40 is performing an oscillating operation, and that indicates a predetermined potential when the VCO 40 has stopped an oscillating operation.

The constant current circuit 80 runs a predetermined current Ic to the ground. More specifically, the constant current circuit 80 sets the summation value of the current that runs from the first contact point 62 to the ground via the amplifying circuit 54 and the current that runs from the second contact point 64 to the ground via the amplifying circuit 54, to be a fixed value Ic. In the present example, the constant current circuit 80 operates by receiving the second bias voltage Vbais2 from the bias circuit 78. Accordingly, when the second bias voltage Vbais2 is grounded, the constant current circuit 80 cuts off the current running from the resonance circuit 52 to the ground via the amplifying circuit 54.

The positive-side capacitor 82 is connected in series between the first contact point 62 on the resonance circuit 52 and the positive-side oscillating signal output end 94. The positive-side capacitor 82 is able to cut off the current running from the first contact point 62 to the positive-side oscillating signal output end 94.

The negative-side capacitor 84 is connected in series between the second contact point 64 on the resonance circuit 52 and the negative-side oscillating signal output end 96. The negative-side capacitor 84 is able to cut off the current running from the second contact point 64 to the negative-side oscillating signal output end 96.

The first amplifying transistor 86 receives, at the base, a noninversion oscillating signal 530 outputted from the first contact point 62 of the resonance circuit 52. The negative-side bias resistance 88 supplies the first bias voltage Vbais1 to the base of the first amplifying transistor 86. Then the first amplifying transistor 86 feeds back the current resulting from amplifying the received noninversion oscillating signal 530, to the second contact point 64 of the resonance circuit 52.

The first amplifying transistor 86 may be an npn transistor, as an example. In this case, the base of the first amplifying transistor 86 may be connected to the wiring between the positive-side oscillating signal output end 94 and the positive-side capacitor 82, the collector thereof is connected to the second contact point 64, and the emitter thereof is connected to the constant current circuit 80.

Such a first amplifying transistor 86 functions as a switch connected between the second contact point 64 and the constant current circuit 80. That is, the first amplifying transistor 86 is turned ON when the voltage between the positive-side oscillating signal output end 94 and the positive-side capacitor 82 is higher than a reference voltage, and is turned OFF when the voltage between the positive-side oscillating signal output end 94 and the positive-side capacitor 82 is a reference voltage or lower.

The second amplifying transistor 90 receives, at the base, an inversion oscillating signal 530 outputted from the second contact point 64 of the resonance circuit 52. The positive-side bias resistance 92 supplies the first bias voltage Vbais1 to the base of the second amplifying transistor 90. Then the second amplifying transistor 90 feeds back the current resulting from amplifying the received inversion oscillating signal 530, to the first contact point 62 of the resonance circuit 52.

The second amplifying transistor 90 may be an npn transistor, as an example. In this case, the base of the second amplifying transistor 90 is connected to the wiring between the negative-side oscillating signal output end 96 and the negative-side capacitor 84, the collector thereof is connected to the first contact point 62, and the emitter thereof is connected to the constant current circuit 80.

Such a second amplifying transistor 90 functions as a switch connected between the first contact point 62 and the constant current circuit 80. That is, the second amplifying transistor 90 is turned ON when the voltage between the negative-side oscillating signal output end 96 and the negative-side capacitor 84 is higher than a reference voltage, and is turned OFF when the voltage between the negative-side oscillating signal output end 96 and the negative-side capacitor 84 is a reference voltage or lower.

The amplifying circuit 54 as stated above is able to perform an inverting amplification to the noninversion oscillating signal 530 outputted from the first contact point 62 of the resonance circuit 52, and to feed back the result to the second contact point 64 of the resonance circuit 52. Together with this operation, the amplifying circuit 54 is able to perform an inverting amplification to the inversion oscillating signal 530 outputted from the second contact point 64 of the resonance circuit 52, and to feed back the result to the first contact point 62 of the resonance circuit 52. According to this, the resonance circuit 52 and the amplifying circuit 54 are able to perform positive feedback amplification to a differential oscillating signal 530 of a predetermined frequency.

Figure 6:
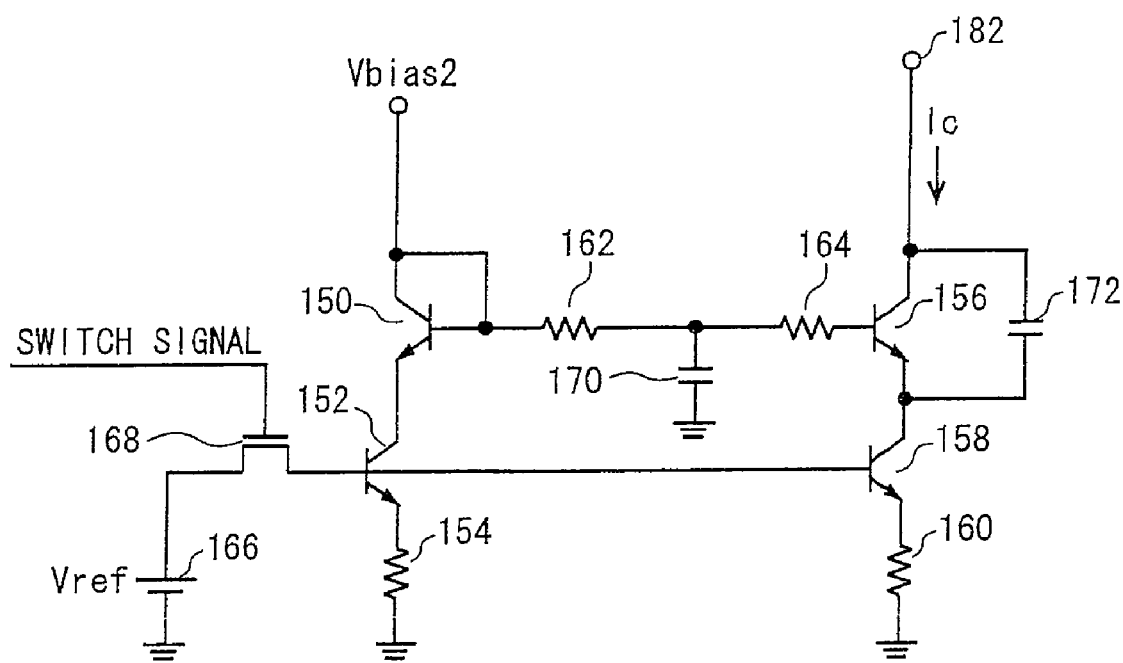
FIG. 6 shows one example of a circuit configuration of a constant current circuit 80.

FIG. 6 shows one example of a circuit configuration of a constant current circuit 80. The constant current circuit 80 includes a control transistor 150, a first bias transistor 152, a first reference resistance 154, a current supply transistor 156, a second bias transistor 158, a second reference resistance 160, a first base resistance 162, a second base resistance 164, a reference voltage supply 166, a constant-current-circuit main switch 168, a base connection capacitor 170, and a parallel capacitor 172.

The control transistor 150 is short-circuited between the base and the collector, and the collector is connected to the input end of the second bias Vbias2. The collector of the first bias transistor 152 is connected to the emitter of the control transistor 150, and the emitter thereof is connected to the ground via the first reference resistance 154. The first reference resistance 154 has a predetermined resistance value.

The current supply transistor 156 may be a transistor of the same kind and substantially the same characteristic as the control transistor 150. The collector of the current supply transistor 156 is connected to a load connection end 182 of the constant current circuit 80. The current supply transistor 156 is connected to the first amplifying transistor 86 and the second amplifying transistor 90 of the amplifying circuit 54 via the load connection end 182.

The collector of the second bias transistor 158 is connected to the emitter of the current supply transistor 156, and the emitter thereof is connected to the ground via the second reference resistance 160. The second reference resistance 160 has the same resistance value as the resistance value of the first reference resistance 154.

The first base resistance 162 and the second base resistance 164 are connected in series between the base of the control transistor 150 and the base of the current supply transistor 156. The first bias transistor 152, the current supply transistor 156, the first base resistance 162, and the second base resistance 164, connected in the above manner, function as a current mirror circuit in which the collector current that is the same as the collector current of the control transistor 150 runs to the current supply transistor 156. The current supply transistor 156 is provided among the first amplifying transistor 86, the second amplifying transistor 90, and the ground potential, and is able to define the summation of the collector current for the first amplifying transistor 86 and the second amplifying transistor 90.

The reference voltage supply 166 generates a reference voltage Vref. The reference voltage supply 166 may be a band gap reference, as an example.

The constant-current-circuit main switch 168 is turned ON/OFF according to a switch signal indicating oscillation of the VCO 40 and oscillating stop of the VCO 40. When the switch signal indicates the oscillating operation of the VCO 40, the constant-current-circuit main switch 168 supplies the reference voltage Vref generated by the reference voltage supply 166, to the base of the first bias transistor 152. When the switch signal indicates the oscillating stop of the VCO 40, the constant-current-circuit main switch 168 turns OFF between the reference voltage supply 166 and the base of the first bias transistor 152.

When the switch signal indicates the oscillating operation of the VCO 40, such a constant-current-circuit main switch 168 is able to supply the reference voltage Vref to the base of the first bias transistor 152, and to set between the collector and the emitter of the first bias transistor 152, to a predetermined bias voltage. When the switch signal indicates the oscillating stop of the VCO 40, the constant-current-circuit main switch 168 is able to supply the ground potential to the base of the first bias transistor 152, and to open between the collector and the emitter of the first bias transistor 152.

The base connection capacitor 170 is connected between the wiring between the first base resistance 162 and the second base resistance 164 and the ground. The parallel capacitor 172 is provided between the collector and the emitter of the current supply transistor 156. The base connection capacitor 170 and the parallel capacitor 172 are able to remove a high-frequency noise included in the constant current running to the constant current circuit 80. In particular, the parallel capacitor 172 is able to remove more high-frequency noise than in cases where the parallel capacitor 172 is provided between the collector and the ground of the current supply transistor 156.

When the switch signal indicates oscillation of the VCO 40, in such a constant current circuit 80, between the collector and the emitter of the first bias transistor 152 and the second bias transistor 158 will be at a predetermined bias voltage. As a result, a predetermined fixed collector current runs to the control transistor 150. Since the control transistor 150 and the current supply transistor 156 will function as a current mirror circuit, a collector current that is proportional to a collector current running to the control transistor 150 will run to the current supply transistor 156. As an example, a collector current that is the same as a collector current running to the control transistor 150 will run to the current supply transistor 156. In this way, when the VCO 40 is to oscillate, the constant current circuit 80 is able to run a constant current to the first amplifying transistor 86 and the second amplifying transistor 90.

In addition, when the switch signal indicates the oscillating stop of the VCO 40, in such a constant current circuit 80, between the collector and the emitter of the first bias transistor 152 and the second bias transistor 158 will be open. As a result, the collector current of the control transistor 150 will be 0, and accordingly the collector current of the current supply transistor 156 will also be 0. In this way, when the VCO 40 is to stop oscillation, the constant current circuit 80 is able to cut off the current running to the first amplifying transistor 86 and the second amplifying transistor 90.

Figure 7:
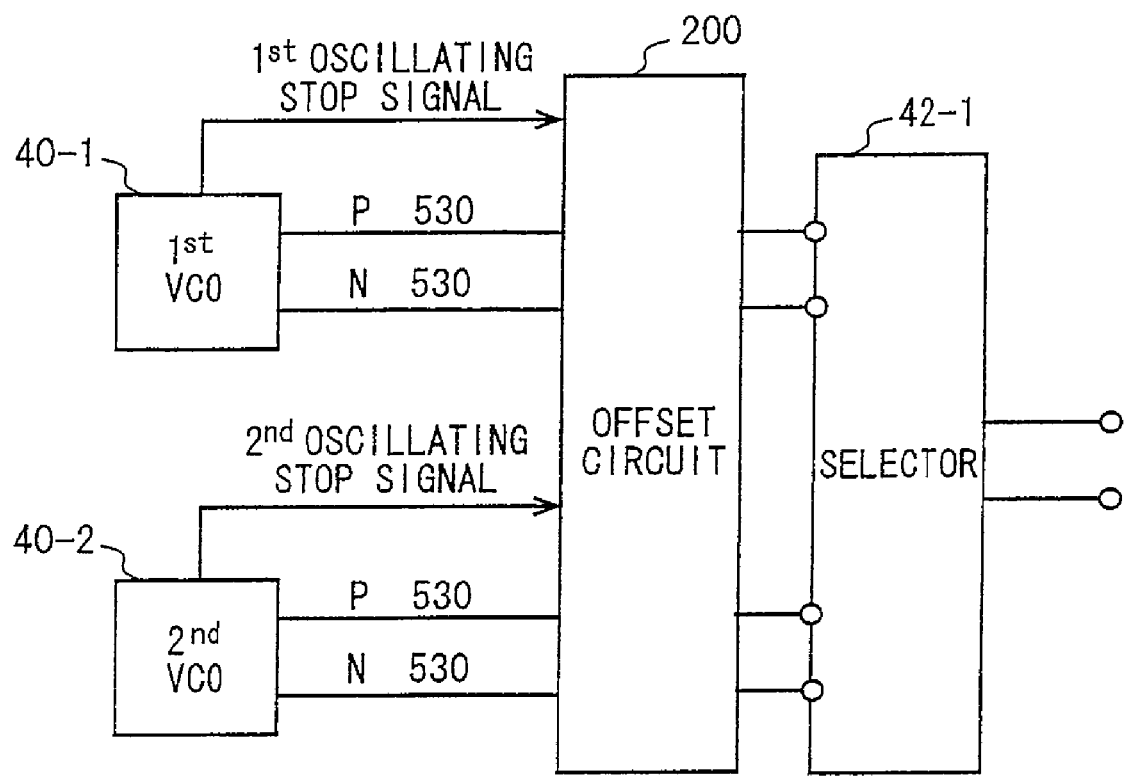
FIG. 7 shows a partial configuration of an oscillating signal generating section 20 that further includes an offset circuit 200.

FIG. 7 shows a partial configuration of an oscillating signal generating section 20 that further includes an offset circuit 200. In more detail, FIG. 7 shows a first VCO 40-1, a second VCO 40-2, a first selector 42-1, and the offset circuit 200.

When the VCO 40 outputs a differential oscillating signal 530, the oscillating signal generating section 20 may further include the offset circuit 200. The offset circuit 200 is provided in the prior stage of a differential amplifier that amplifies a differential signal. The offset circuit 200 supplies an offset voltage between the positive-side input end and the negative-side input end of an amplifying section, on condition that a differential signal transmitted from the circuit in the prior stage to the amplifying amplifier is stopped.

The positive-side input end and the negative-side input end of the differential amplifier will be at the same potential (e.g. ground potential), when the prior-stage circuit stops outputting a differential signal. For this reason, when the prior-stage circuit stops outputting a differential signal, the differential amplifier undergoes reversal of the positive/negative of the potential between the positive-side input end and the negative-side input end, even with a minute noise applied thereto, to cause abnormal oscillation. However, if provided with an offset circuit 200, a differential amplifier does not undergo reversal of the positive/negative of the potential between the positive-side input end and the negative-side input end, even with a noise applied thereto, and does not cause abnormal oscillation. In this way, the offset circuit 200 is able to prevent the differential amplifier from causing abnormal oscillation, in a case where the prior-stage circuit stops outputting a differential signal.

In the present embodiment, the offset circuit 200 supplies an offset voltage between the positive-side input end and the negative-side input end in a selector 42 that receives an oscillating signal 530, on condition that outputting of an oscillating signal 530 inputted to a selector 42 is stopped. Accordingly, even when a VCO 40 has stopped an oscillating operation, the offset circuit 200 is able to prevent the selector 42 connected to the VCO 40 having stopped operating, from causing abnormal oscillation.

As an example, the offset circuit 200 may supply an offset voltage between the positive-side input end and the negative-side input end, by connecting one of the positive-side input end and the negative-side input end to a predetermined potential such as a power supply potential. In addition, as an example, the offset circuit 200 may supply an offset voltage between the positive-side input end and the negative-side input end, by connecting the positive-side input end to a predetermined positive potential, and the negative-side input end to a predetermined negative potential (or by connecting the positive-side input end to a predetermined negative potential, and the negative-side input end to a predetermined positive potential).

In addition, as an example, the oscillating signal generating section 20 may include an offset circuit 200 in correspondence with a selector 42 positioned at the end of the tree structure of the plurality of selectors 42. That is, as shown in FIG. 7, the oscillating signal generating section 20 may include an offset circuit 200 in correspondence with a selector 42 to which a differential oscillating signal 530 outputted from the VCO 40 is directly inputted. In other words, the oscillating signal generating section 20 does not have to include an offset circuit 200 in correspondence with a selector 42 positioned other than at the end of the tree structure.

In the plurality of selectors 42 connected in the tree structure, a differential signal inputted to a selector 42 positioned other than at the end will be stabilized once a differential signal inputted to a selector 42 positioned at the end. Accordingly, the oscillating signal generating section 20 is able to prevent all the plurality of selectors 42 from causing abnormal oscillation, by including an offset circuit 200 in correspondence with a selector 42 positioned at the end of the tree structure.

In addition, as an example, the offset circuit 200 may supply an offset voltage between the positive-side input end and the negative-side input end that receive an oscillating signal 530 outputted from a corresponding VCO 40, on condition that an oscillating stop signal indicating that the oscillating operation has been stopped and being outputted by a corresponding VCO 40 is received. In the present embodiment, a VCO 40 outputs an oscillating stop signal that yields a first bias potential (Vbias1) when the oscillation has been stopped, and that yields the ground potential when the oscillation is being performed. According to this, the offset circuit 200 is able to control application and non-application of the offset voltage, without receiving a control signal distributed from the central control section, for example.

Figure 8:
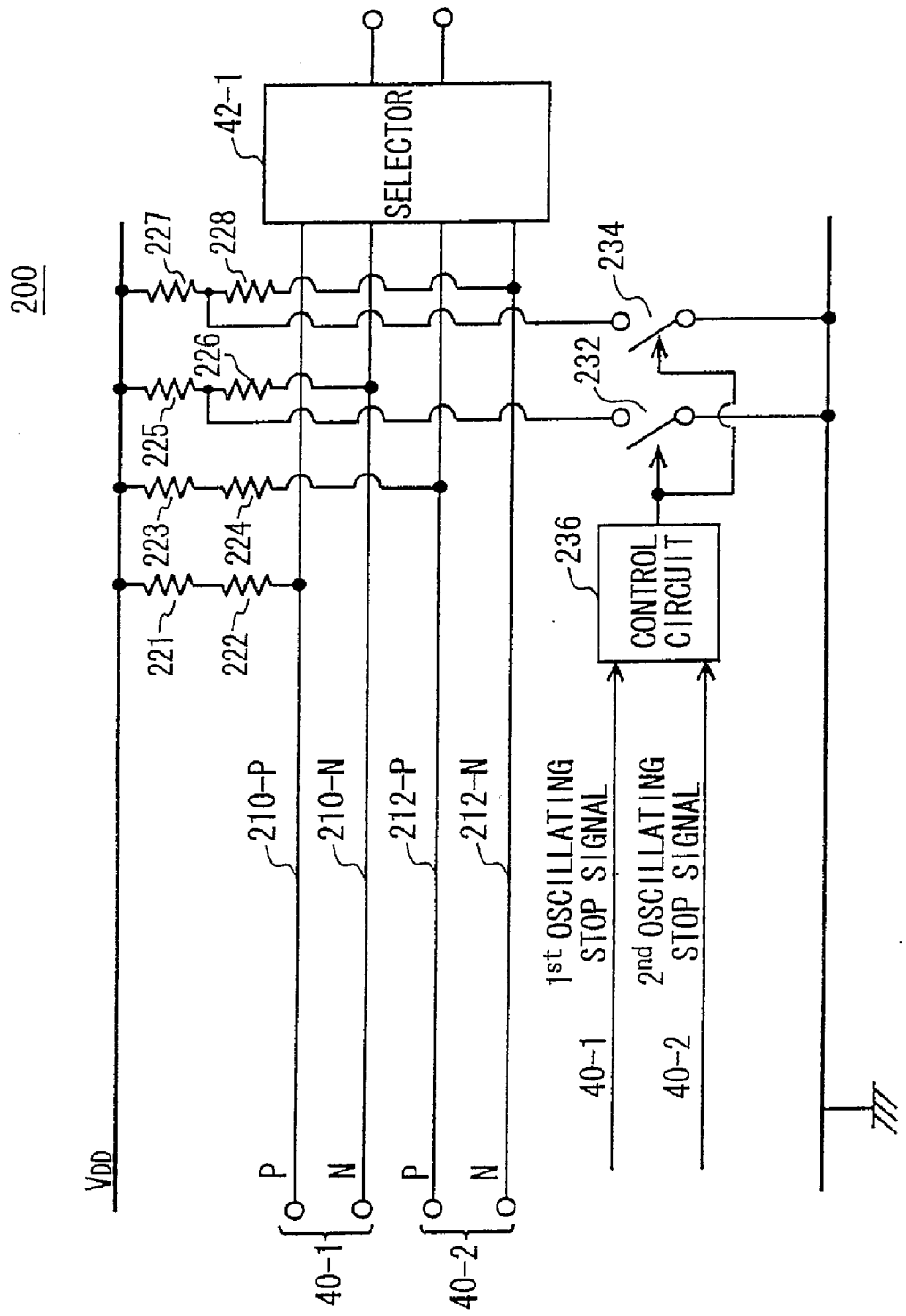
FIG. 8 shows one example of a configuration of an offset circuit 200 provided in correspondence with a first selector 42-1, together with a selector 42.

FIG. 8 shows one example of a configuration of an offset circuit 200 provided in correspondence with a first selector 42-1, together with a selector 42. As an example, the offset circuit 200 includes a first offset resistance 221, a second offset resistance 222, a third offset resistance 223, a fourth offset resistance 224, a fifth offset resistance 225, a sixth offset resistance 226, a seventh offset resistance 227, an eighth offset resistance 228, a first VCO switch 232, a second VCO switch 234, and a control circuit 236.

The first offset resistance 221 and the second offset resistance 222 are connected in series between the power supply voltage (Vdd) and the positive-side first VCO output wiring 210-P. The positive-side first VCO output wiring 210-P conveys a noninversion signal of the differential oscillating signal 530 outputted from the first VCO 40-1, to the first selector 42-1.

The third offset resistance 223 and the fourth offset resistance 224 are connected in series between the power supply voltage (Vdd) and the positive-side second VCO output wiring 212-P. The positive-side second VCO output wiring 212-P conveys a noninversion signal of the differential oscillating signal 530 outputted from the second VCO 40-2, to the first selector 42-1.

The fifth offset resistance 225 and the sixth offset resistance 226 are connected in series between the power supply voltage (Vdd) and the negative-side first VCO output wiring 210-N. The negative-side first VCO output wiring 210-N conveys a noninversion signal of the differential oscillating signal 530 outputted from the first VCO 40-1, to the first selector 42-1.

The seventh offset resistance 227 and the eighth offset resistance 228 are connected in series between the power supply voltage (Vdd) and the negative-side second VCO output wiring 212-N. The negative-side second VCO output wiring 212-N conveys a noninversion signal of the differential oscillating signal 530 outputted from the second VCO 40-2, to the first selector 42-1.

The first offset resistance 221, the second offset resistance 222, the third offset resistance 223, the fourth offset resistance 224, the fifth offset resistance 225, the sixth offset resistance 226, the seventh offset resistance 227, and the eighth offset resistance 228 may have the same resistance value. In addition, the power supply voltage (Vdd) may be either a positive-side potential or a negative-side potential.

The first VCO switch 232 turns ON/OFF between the wiring between the fifth offset resistance 225 and the sixth offset resistance 226, and the ground. The second VCO switch 234 turns ON/OFF between the wiring between the seventh offset resistance 227 and the eighth offset resistance 228, and the ground. The first VCO switch 232 and the second VCO switch 234 may turn ON/OFF with respect to the negative-side potential, instead of with respect to the ground.

The control circuit 236 receives a first oscillating stop signal from the first VCO 40-1. The control circuit 236 also receives a second oscillating stop signal from the second VCO 40-2.

The control circuit 236 turns both of the first VCO switch 232 and the second VCO switch 234 to be OFF, when at least one of the first oscillating stop signal and the second oscillating stop signal indicates the oscillating operation (i.e. when at least one of the first VCO 40-1 and the first VCO 40-2 is performing an oscillating operation). In this case, all the input ends of the first selector 42-1 will be pulled up to the power supply voltage (Vdd) at the same resistance value.

As a result, the offset circuit 200 does not supply an offset potential between the positive-side input end and the negative-side input end to which a differential oscillating signal 530 outputted from the first VCO 40-1 is inputted, in the first selector 42-1. Likewise, the offset circuit 200 does not supply an offset potential between the positive-side input end and the negative-side input end to which a differential oscillating signal 530 outputted from the second VCO 40-2 is inputted, in the first selector 42-1.

On the contrary, when both of the first oscillating stop signal and the second oscillating stop signal indicate stopping of the oscillating operation (i.e. when neither of the first VCO 40-1 and the first VCO 40-2 is performing oscillation), the control circuit 236 turns both of the first VCO switch 232 and the second VCO switch 234 to be ON. In this case, the wiring between the fifth offset resistance 225 and the sixth offset resistance 226 will be connected to the ground, and so the positive-side input end to which a positive-side signal of a differential oscillating signal 530 outputted from the first VCO 40-1 is inputted will be pulled down to the ground potential. Likewise, the wiring between the seventh offset resistance 227 and the eighth offset resistance 228 will be connected to the ground, and so the positive-side input end to which a positive-side signal of a differential oscillating signal 530 outputted from the second VCO 40-2 is inputted will be pulled down to the ground potential.

As a result, the offset circuit 200 is able to supply an offset potential between the positive-side input end and the negative-side input end to which a differential oscillating signal 530 outputted from the first VCO 40-1 is inputted, in the first selector 42-1. Likewise, the offset circuit 200 is able to supply an offset potential between the positive-side input end and the negative-side input end to which a differential oscillating signal 530 outputted from the second VCO 40-2 is inputted, in the first selector 42-1.

According to such an offset circuit 200, when both of the first VCO 40-1 and the second VCO 40-2 have stopped the oscillating operation, it is possible to prevent the first selector 42-1 from causing abnormal oscillation. Note that when one of the first VCO 40-1 and the second VCO 40-2 is performing the oscillating operation, and the other of them has stopped the oscillating operation, the first selector 42-1 outputs, after selection, an oscillating signal 530 outputted from the selector 42 that is performing the oscillating operation, and so abnormal oscillation does not occur. Consequently, in such a case, the offset circuit 200 does not supply an offset voltage between the positive-side input end and the negative-side input end corresponding to the VCO 40 that has stopped the oscillating operation. Note that the selector 42-1 may receive three or more sets of differential oscillating signals 530, and outputs one selected set of differential oscillating signals 530.

In the above, some aspects of the present invention have been described by way of exemplary embodiments. However, it is needless to say that the technical scope of the present invention should not be limited by the above-described embodiments. It should be understood that those skilled in the art might make various types of modifications and substitutions to the above-described embodiments without departing from the spirit and the scope of the present invention. It is obvious from the appended claims that embodiments with such modifications or substitutions also belong to the technical scope of the present invention.

What is claimed is:

1. An oscillating apparatus comprising:
   a plurality of variable frequency oscillators, each of which is provided in correspondence with a different oscillating band from one another; and
   a selection section that selects an oscillating signal that is from a variable frequency oscillator provided in correspondence with a designated oscillating band, from among the plurality of variable frequency oscillators, and outputs the selected oscillating signal,
   wherein the selection section includes a plurality of selectors connected in a tree structure, each selector outputting a selected one of inputted two or more oscillating signals,
   each of the plurality of variable frequency oscillators is connected to a selector positioned at an end of the tree structure of the plurality of selectors, and
   a number of selectors through which an oscillating signal outputted from one of the variable frequency oscillators passes until being outputted from the oscillating apparatus is smaller than a number of selectors through which an oscillating signal outputted from at least one of the other variable frequency oscillators provided in correspondence with an oscillating band of a frequency lower than a frequency of the one variable frequency oscillator passes until being outputted from the oscillating apparatus.

2. The oscillating apparatus as set forth in claim 1, wherein wiring through which an oscillating signal outputted from one of the variable frequency oscillators passes until being outputted from the oscillating apparatus is shorter than wiring through which an oscillating signal outputted from at least one of the other variable frequency oscillators provided in correspondence with an oscillating band of a frequency lower than a frequency of the one variable frequency oscillator passes until being outputted from the oscillating apparatus.

3. The oscillating apparatus as set forth in claim 2, wherein each of the variable frequency oscillators includes a resonance circuit provided in an adjacent area, and an amplifying circuit amplifying a resonance of the resonance circuit and outputting the result as an oscillating signal, and
   two of the variable frequency oscillators connected to a selector positioned at an end of the tree structure of the plurality of selectors are provided so that respective amplifying circuits are placed in areas adjacent to each other, and so that respective two resonance circuits are provided in position sandwiching the two amplifying circuits.

4. The oscillating apparatus as set forth in claim 3, further comprising:
an oscillating control section that stops oscillation of at least one variable frequency oscillator provided in correspondence with an oscillating band different from the designated oscillating band, from among the plurality of variable frequency oscillators.

5. The oscillating apparatus as set forth in claim 4, wherein the amplifying circuit included in each of the variable frequency oscillators includes:
a constant current circuit that runs a predetermined current to the ground;
a positive-side capacitor connected in series between a first contact point on the resonance circuit and a positive-side oscillating signal output end of the amplifying circuit;
a negative-side capacitor connected in series between a second contact point on the resonance circuit and a negative-side oscillating signal output end of the amplifying circuit;
a first switch that is connected between the first contact point and the constant current circuit, and that is turned ON when a voltage between the negative-side oscillating signal output end and the negative-side capacitor is higher than a reference voltage; and
a second switch that is connected between the second contact point and the constant current circuit, and that is turned ON when a voltage between the positive-side oscillating signal output end and the positive-side capacitor is higher than a reference voltage, and
when stopping oscillation of the variable frequency oscillator, the oscillating control section grounds the positive-side oscillating signal output end and the negative-side oscillating signal output end, and cuts off a current running from the constant current circuit to the ground.

6. The oscillating apparatus as set forth in claim 4, further comprising:
a phase comparator that compares a phase of an oscillating signal outputted from the selection section and a phase of a reference clock, and controls a frequency of an oscillating signal outputted from a variable frequency oscillator provided in correspondence with the designated oscillating band based on the comparison result.

7. An oscillating apparatus comprising:
a plurality of variable frequency oscillators, each of which is provided in correspondence with a different oscillating band from one another and outputs a differential oscillating signal;
a selection section that selects an oscillating signal that is from a variable frequency oscillator provided in correspondence with a designated oscillating band, from among the plurality of variable frequency oscillators, and outputs the selected oscillating signal; and
an offset circuit that supplies an offset voltage between a positive-side input end and a negative-side input end of a selector receiving an oscillating signal, on condition that the oscillating signal inputted to the selector is stopped,
wherein the selection section includes a plurality of selectors connected in a tree structure, each selector outputting a selected one of inputted two or more oscillating signals, and
each of the plurality of variable frequency oscillators is connected to a selector positioned at an end of the tree structure of the plurality of selectors.

8. The oscillating apparatus as set forth in claim 7, wherein the offset circuit is provided in correspondence with a selector positioned at an end of the tree structure of the plurality of selectors.

9. The oscillating apparatus as set forth in claim 8, wherein the variable frequency oscillators generate an oscillating stop signal indicating that an oscillating operation has been stopped when the oscillating operation has been stopped, and
the offset circuit supplies an offset voltage between the positive-side input end and the negative-side input end that receive the oscillating signal outputted from a corresponding one of the variable frequency oscillators, on condition that the oscillating stop signal is received from the corresponding variable frequency oscillator.

10. An oscillating apparatus comprising:
a plurality of variable frequency oscillators, each of which is provided in correspondence with a different oscillating band from one another; and
a selection section that selects an oscillating signal that is from a variable frequency oscillator provided in correspondence with a designated oscillating band, from among the plurality of variable frequency oscillators, and outputs the selected oscillating signal,
wherein the selection section includes a plurality of selectors connected in a tree structure, each selector outputting a selected one of inputted two or more oscillating signals,
each of the plurality of variable frequency oscillators is connected to a selector positioned at an end of the tree structure of the plurality of selectors, and
wiring through which an oscillating signal outputted from one of the variable frequency oscillators passes until being outputted from the oscillating apparatus is shorter than wiring through which an oscillating signal outputted from at least one of the other variable frequency oscillators provided in correspondence with an oscillating band of a frequency lower than a frequency of the one variable frequency oscillator passes until being outputted from the oscillating apparatus.

11. The oscillating apparatus as set forth in claim 10, wherein
each of the variable frequency oscillators includes a resonance circuit provided in an adjacent area, and an amplifying circuit amplifying a resonance of the resonance circuit and outputting the result as an oscillating signal, and
two of the variable frequency oscillators connected to a selector positioned at an end of the tree structure of the plurality of selectors are provided so that respective amplifying circuits are placed in areas adjacent to each other, and so that respective two resonance circuits are provided in position sandwiching the two amplifying circuits.

12. The oscillating apparatus as set forth in claim 11, further comprising:
an oscillating control section that stops oscillation of at least one variable frequency oscillator provided in correspondence with an oscillating band different from the designated oscillating band, from among the plurality of variable frequency oscillators.

13. The oscillating apparatus as set forth in claim 12, wherein the amplifying circuit included in each of the variable frequency oscillators includes:
- a constant current circuit that runs a predetermined current to the ground;
- a positive-side capacitor connected in series between a first contact point on the resonance circuit and a positive-side oscillating signal output end of the amplifying circuit;
- a negative-side capacitor connected in series between a second contact point on the resonance circuit and a negative-side oscillating signal output end of the amplifying circuit;
- a first switch that is connected between the first contact point and the constant current circuit, and that is turned ON when a voltage between the negative-side oscillating signal output end and the negative-side capacitor is higher than a reference voltage; and
- a second switch that is connected between the second contact point and the constant current circuit, and that is turned ON when a voltage between the positive-side oscillating signal output end and the positive-side capacitor is higher than a reference voltage, and
when stopping oscillation of the variable frequency oscillator, the oscillating control section grounds the positive-side oscillating signal output end and the negative-side oscillating signal output end, and cuts off a current running from the constant current circuit to the ground.

14. The oscillating apparatus as set forth in claim 12, further comprising:
- a phase comparator that compares a phase of an oscillating signal outputted from the selection section and a phase of a reference clock, and controls a frequency of an oscillating signal outputted from a variable frequency oscillator provided in correspondence with the designated oscillating band based on the comparison result.

15. An oscillating method comprising:
- providing a plurality of variable frequency oscillators each in correspondence with a different oscillating band from one another;
- selecting, by each of a plurality of selectors connected in a tree structure, one of two or more oscillating signals inputted from a variable frequency oscillator provided in correspondence with a designated oscillating band, from among the plurality of variable frequency oscillators, and outputting the selected oscillating signal;
- outputting, by each of the variable frequency oscillators, a differential oscillating signal; and
- supplying an offset voltage between a positive-side input end and a negative-side input end of a selector receiving an oscillating signal, on condition that the oscillating signal inputted to the selector is stopped.

16. The oscillating method as set forth in claim 15, wherein
- the supplying is by an offset circuit provided in correspondence with a selector positioned at an end of the tree structure of the plurality of selectors.

17. The oscillating method as set forth in claim 16, further comprising:
- generating, by the variable frequency oscillators, an oscillating stop signal indicating that an oscillating operation has been stopped when the oscillating operation has been stopped,
- wherein the supplying comprises supplying an offset voltage between the positive-side input end and the negative-side input end that receive the oscillating signal outputted from a corresponding one of the variable frequency oscillators, on condition that the oscillating stop signal is received from the corresponding variable frequency oscillator.

* * * * *